US008576015B2

(12) United States Patent
Lee

(10) Patent No.: US 8,576,015 B2
(45) Date of Patent: Nov. 5, 2013

(54) SIGNAL GENERATOR

(75) Inventor: Yong Jae Lee, Yongin-si (KR)

(73) Assignee: Anapass Inc., Seoul (KR)

( * ) Notice: Subject to any disclaimer, the term of this patent is extended or adjusted under 35 U.S.C. 154(b) by 0 days.

(21) Appl. No.: 12/964,172

(22) Filed: Dec. 9, 2010

(65) Prior Publication Data

US 2011/0140797 A1      Jun. 16, 2011

(30) Foreign Application Priority Data

Dec. 14, 2009 (KR) .................. 10-2009-0124034

(51) Int. Cl.
 *H03K 3/282* (2006.01)

(52) U.S. Cl.
 USPC .............. 331/117 R; 331/36 L; 331/167

(58) Field of Classification Search
 USPC .................. 331/36 L, 117 R, 167, 181
 See application file for complete search history.

(56) References Cited

U.S. PATENT DOCUMENTS

| | | | | |
|---|---|---|---|---|
| 5,629,553 | A * | 5/1997 | Ikeda et al. ................... | 257/531 |
| 6,404,317 | B1 * | 6/2002 | Mizoguchi et al. ............ | 336/200 |
| 7,154,349 | B2 * | 12/2006 | Cabanillas ................ | 331/117 R |
| 7,515,006 | B2 | 4/2009 | Bagger et al. | |
| 7,791,900 | B2 * | 9/2010 | Fouquet et al. .............. | 361/803 |
| 2003/0227354 | A1 * | 12/2003 | Utsunomiya et al. ......... | 333/174 |
| 2005/0068146 | A1 * | 3/2005 | Jessie ............................ | 336/200 |
| 2007/0085617 | A1 * | 4/2007 | Salerno ......................... | 331/167 |
| 2007/0146089 | A1 * | 6/2007 | Komurasaki et al. ......... | 331/167 |
| 2009/0189725 | A1 * | 7/2009 | Ding et al. .................... | 336/137 |

FOREIGN PATENT DOCUMENTS

| | | |
|---|---|---|
| CN | 100464420 C | 2/2009 |
| KR | 1998-0044524 A | 11/1999 |
| KR | 2005-0101022 A | 10/2005 |
| KR | 2007-0042711 A | 4/2007 |
| KR | 2008-0024277 A | 3/2008 |

OTHER PUBLICATIONS

Jul. 25, 2012 Office Action issued in Chinese Patent Application No. 201010625189.5 (with translation).

* cited by examiner

*Primary Examiner* — Joseph Chang
*Assistant Examiner* — Jeffrey Shin
(74) *Attorney, Agent, or Firm* — Oliff & Berridge, PLC

(57) ABSTRACT

Provided is a signal generator. The signal generator includes an insulating substrate, a chip disposed on the insulating substrate and including an oscillator including a capacitance element determining a resonant frequency signal, and a plurality of conductive lines disposed on the same surface of the insulating substrate to be spaced apart from each other. At least one of the plurality of conductive lines is electrically connected with the oscillator and provides an inductance element determining the resonant frequency signal to the oscillator.

14 Claims, 4 Drawing Sheets

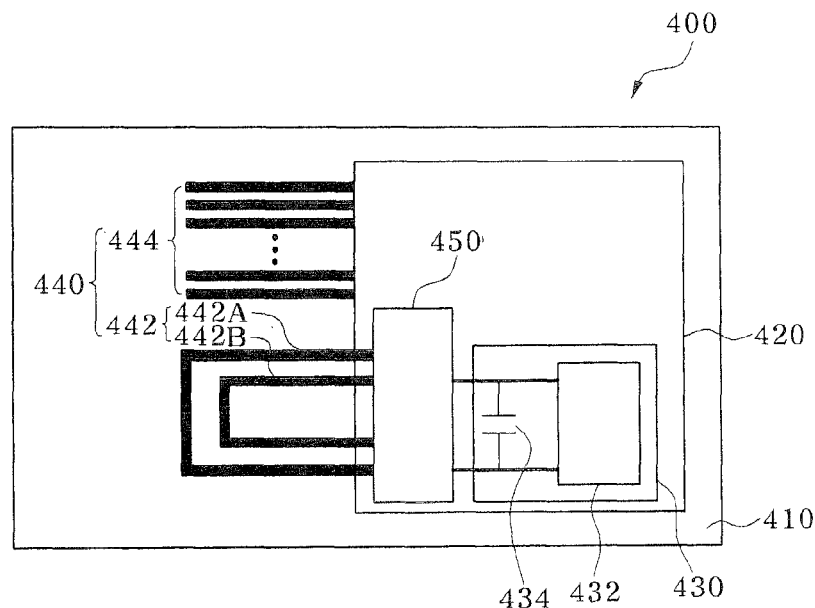
FIG. 4(a)
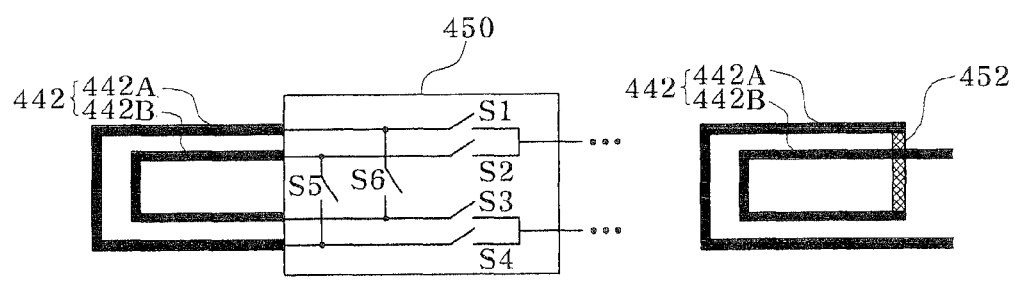
FIG. 4(b)   FIG. 4(c)

SIGNAL GENERATOR

TECHNICAL FIELD

The described technology relates generally to a signal generator, and more particularly, to a signal generator including an oscillator.

BACKGROUND

In the fields of wired and wireless communication, the necessity for high-speed mass data transmission is increasing. To this end, use of a high-speed serial interface transmitting a clock and data through the same signal line has been increasing lately. When the high-speed interface operates, a circuit having a low jitter characteristic is required to maintain performance. The high-speed serial interface generally has a clock and data recovery (CDR) circuit employing a phase-locked loop (PLL) for clock recovery and data sampling therein. A part of the CDR circuit having the highest probability of causing jitter is a voltage controlled oscillator (VCO). The overall jitter characteristic of the VCO is determined by several jitter sources such as thermal noise, flicker noise, and supply noise. Thus, a VCO needs to be designed to be insensitive to the several jitter sources and have a low jitter characteristic.

SUMMARY

In one embodiment, a signal generator is provided. The signal generator includes: an insulating substrate; a chip disposed on the insulating substrate and including an oscillator including a capacitance element determining a resonant frequency signal; and a plurality of conductive lines disposed on the same surface of the insulating substrate to be spaced apart from each other. At least one of the plurality of conductive lines is electrically connected with the oscillator and provides an inductance element determining the resonant frequency signal to the oscillator.

The Summary is provided to introduce a selection of concepts in a simplified form that are further described below in the Detailed Description. The Summary is not intended to identify key features or essential features of the claimed subject matter, nor is it intended to be used as an aid in determining the scope of the claimed subject matter.

BRIEF DESCRIPTION OF THE DRAWINGS

The above and other features and advantages of the present disclosure will become more apparent to those of ordinary skill in the art by describing in detail example embodiments thereof with reference to the attached drawings in which:

FIGS. 4(a), 4(b) and 4(c) illustrate a signal generator according to still another embodiment of the present disclosure.

DETAILED DESCRIPTION

Figure 1A:
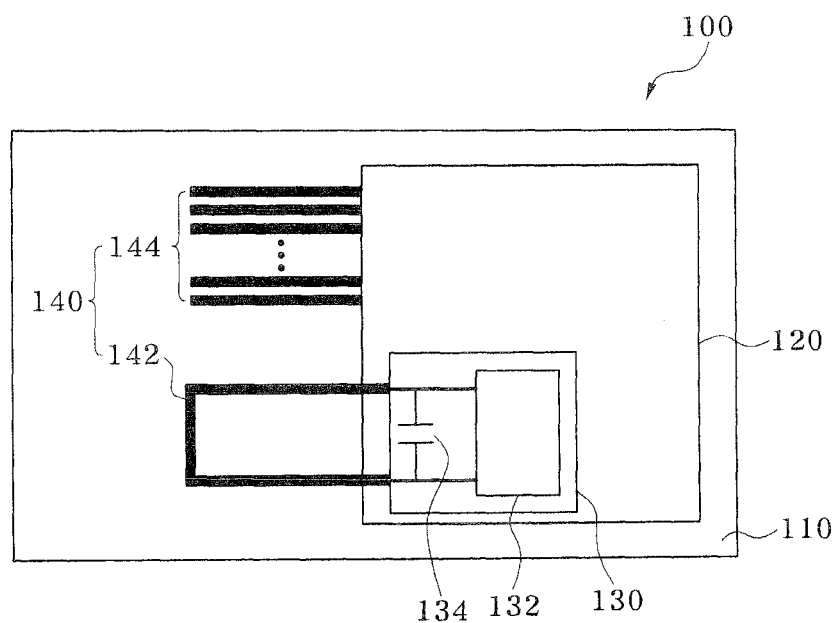
FIGS. 1(a) and 1(b) illustrate a signal generator according to an embodiment of the present disclosure.

It will be readily understood that the components of the present disclosure, as generally described and illustrated in the Figures herein, could be arranged and designed in a wide variety of different configurations. Thus, the following more detailed description of the embodiments of apparatus and methods in accordance with the present disclosure, as represented in the Figures, is not intended to limit the scope of the disclosure, as claimed, but is merely representative of certain examples of embodiments in accordance with the disclosure. The presently described embodiments will be best understood by reference to the drawings, wherein like parts are designated by like numerals throughout.

Meanwhile, terms used herein are to be understood as follows.

It will be understood that, although the terms first, second, etc. may be used herein to describe various elements, these elements should not be limited by these terms.

These terms are only used to distinguish one element from another. For example, a first element could be termed a second element, and, similarly, a second element could be termed a first element, without departing from the scope of the present disclosure.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," "on" versus "directly on," etc.).

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises," "comprising," " includes" and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or, the blocks may sometimes be executed in the reverse order, depending upon the functionality/acts involved.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
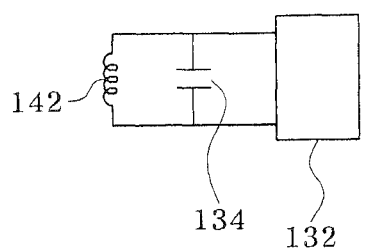

FIG. 1 illustrates a signal generator according to an embodiment of the present disclosure. FIGS. 1(A) and 1(B) are conceptual diagrams of a signal generator and an inductor-capacitor (LC) oscillator, respectively. Referring to FIG. 1, a signal generator 100 includes an insulating substrate 110, a chip 120, and a plurality of conductive lines 140.

Various types of substrates can be used as the insulating substrate 110. For example, the insulating substrate 110 may be a plastic substrate, a plastic film, or a flexible printed circuit board (PCB). In the drawing, a flexible PCB is shown as an example of the substrate 110. Due to its flexibility, the flexible PCB is frequently used for three-dimensional (3D) interconnections requiring bending, overlapping, folding, etc. A material of the flexible PCB may be, for example, polyester, or polyimide. The flexible PCB may be, for example, a driver integrated circuit (IC) substrate.

The chip 120 is disposed on the insulating substrate 110, and includes an oscillator 130 including a capacitance element which determines a resonant frequency signal. In the drawing, the oscillator 130 including a capacitor 134 is shown as an example. The oscillator 130 generates an oscillation frequency signal using the resonant frequency signal of a resonator. The oscillator 130 includes an oscillator core 132, and the oscillator core 132 generates the oscillation frequency signal using the resonant frequency signal. The resonator may be an LC resonator. A resonant frequency of the LC resonator is expressed as $$f_0 = \frac{1}{2\pi\sqrt{LC}}$$

(where L and C denote inductance and capacitance, respectively). The resonant frequency of the LC resonator can be adjusted by changing the inductance or capacitance. In this way, the oscillation frequency of the oscillator 130 can be adjusted. The capacitor 134 provides the capacitance element to the oscillator 130. Various types of capacitors can be used as the capacitor 134. As an example, the capacitor 134 may be a fixed capacitor. The fixed capacitor may be a metal-oxide semiconductor (MOS) capacitor, a metal-insulator-metal (MIM) capacitor, or a metal-oxide-metal (MOM) capacitor. As another example, the capacitor 134 may be a variable capacitor. The capacitance of the variable capacitor can be controlled by voltage. The variable capacitor whose capacitance is controlled by voltage may be, for example, a varactor diode, or a MOS capacitor. In this case, an LC voltage controlled oscillator (VCO) can be implemented using the oscillator 130 and an external inductor. As still another example, the capacitor 134 may be a combination of the fixed capacitor and the variable capacitor. The capacitor 134 may be integrated in the oscillator 130. The capacitor 134 integrated in the oscillator 130 may include parasitic capacitance of the oscillator 130 itself. In other words, when the oscillation frequency of the oscillator 130 is too high to ignore internal capacitance of the oscillator core 132, the capacitor 134 may be designed with the internal capacitance of the oscillator core 132 taken into consideration.

The chip 120 including the oscillator 130 may be, for example, at least one selected from among a phase-locked loop (PLL), a clock and data recovery (CDR), a driver IC, and a combination thereof. The PLL matches a frequency of an output signal with that of an input signal or a reference frequency. The PLL may use a VCO as a frequency source. The CDR extracts a clock for a synchronization operation from input data in which a clock and data are mixed, and recovers the data using the extracted clock. The CDR may use a VCO as a frequency source. The driver IC may have, for example, an embedded high-speed serial interface for driving a variety of panels (e.g., large panels such as a liquid crystal display (LCD) and an organic light-emitting diode (OLED) display). Using the high-speed serial interface, a clock and data can be transmitted through the same signal line. For clock recovery and data sampling, a general high-speed serial interface has a CDR circuit employing a PLL therein. In this case, the driver IC may use a VCO as a frequency source. This embodiment is an example to aid in understanding the present disclosure, and the chip 120 may include a variety of circuits including the oscillator 130 other than those mentioned above.

The plurality of conductive lines 140 are disposed on the same surface of the insulating substrate 110 to be spaced apart from each other. At least one of the conductive lines 140 is electrically connected with the oscillator 130 and provides an inductance element which determines the resonant frequency signal. The plurality of conductive lines 140 can be electrically connected with the chip 120 including the oscillator 130 in various ways. For example, by inner lead bonding (ILB), the plurality of conductive lines 140 and the chip 120 may be electrically connected with each other. The ILB denotes eutectic bonding or inter-metallic bonding between a bump of the chip 120 and the plurality of conductive lines 140 based on thermocompression bonding. When the chip 120 and the plurality of conductive lines 140 are electrically connected with each other, a signal generated by the chip 120, an external signal (e.g., power) supplied to the chip 120, etc. can be provided through conductive lines 144. For the plurality of conductive lines 140, a variety of conductive materials can be used. The plurality of conductive lines 140 may include, for example, at least one material selected from among gold, copper, aluminum, and a combination thereof. In FIG. 1(A), a conductive line 142 which has one turn and is electrically connected with the oscillator 130 to provide the inductance element is shown as an example. In FIG. 1(B), an equivalent circuit of the LC oscillator employing the conductive line 142 is shown. The conductive line 142 serves as an inductor providing the inductance element to oscillator 130.

Referring back to the drawing, the signal generator 100 includes the oscillator 130 as a frequency source. The oscillator 130 generates the oscillation frequency signal using the resonant frequency signal of the resonator. In the drawing, an oscillator employing an LC resonator is shown as an example of the oscillator 130. The LC oscillator has a lower sensitivity to supply voltage than a ring oscillator. The reason is thought to be that an L and C are relatively less sensitive to a change in supply voltage. In the case of a PLL, noise, which relates to a frequency gain (Kvco; MHz/V) with respect to a control voltage of the oscillator, may also be applied through the control voltage. Since the LC oscillator is less sensitive to a change in process or temperature in comparison with a ring oscillator, Kvco can be reduced to the minimum. Thus, even when noise is generated at a control voltage terminal, the LC oscillator generates much less jitter. Jitter generated by the oscillator itself is influenced by flicker noise, thermal noise, etc. of a device used for the oscillator. In the case of a ring oscillator, the oscillator itself has a quality factor (Q value) of 1, and such noise factors are transferred as an output of the oscillator as they are. On the other hand, since the LC oscillator has a small number of devices causing noise and also a Q value of 1 or more, a caused noise element is filtered by an LC tuned circuit. For this reason, noise or noise elements are reduced in an output. In spite of these advantages of the LC oscillator, the LC oscillator is not used in the driver IC. This is because an inductor having a high Q value is required to use the LC oscillator in the driver IC. To have a high Q value, an inductor needs to include a thick metal layer. This is intended to reduce serial resistance caused by the metal layer used in the inductor. Also, multiple metal layers need to be used to reduce loss caused by interaction with a substrate. In this case, a top metal layer is used as the inductor to increase distance from the semiconductor substrate as much as possible. The loss caused by interaction with the semiconductor substrate may be caused by, for example, eddy current, and displacement current. These are current elements reducing the Q value of the inductor, and are influenced by the distance between the inductor and the semiconductor substrate and resistance of the semiconductor substrate. When a silicon substrate is used as a semiconductor substrate to implement the driver IC, a resistance of the silicon substrate is generally about 10 ohm/square, and a relatively large loss occurs. On the other hand, a substrate having a great resistance such as a silicon-on-insulator (SOI) substrate causes a small loss, but is difficult to use in a driver IC process due to high cost. The above-described requirements for implementing an inductor having a high Q value are compared with a currently-used driver IC process as follows. In the driver IC process, two or three metal layers are used to reduce cost. Thus, it is difficult for the inductor implemented through the driver IC process to have a high Q value because of loss caused by interaction between the inductor and a semiconductor substrate. Also, to reduce the area of the driver IC, a pitch between metal patterns needs to be reduced.

When a thick metal layer is used to implement an inductor having a high Q value, the pitch between metal patterns may increase, resulting in an increase in the area of the driver IC.

In an embodiment of the present disclosure, the inductor 142 is fabricated in a process separate from a process of fabricating the chip 120. In this way, an inductor having a high Q value can be implemented. In other words, as shown in the drawing, the inductor 142 may be implemented to have a high Q value using the at least one line 142 among the plurality of conductive lines 140 disposed on the same surface of the insulating substrate 110 to be spaced apart from each other. The inductor 142 may be implemented through, for example, the following process. The inductor 142 may be implemented on a plastic film having a thickness of about 38 μm and a dielectric constant of about 2.9. The inductor implemented on the plastic film may have an area of about 0.5×1.8 mm$^2$ and a cross-sectional area of about 50×8 μm$^2$. A material of the inductor 142 may be copper. The area denotes an area surrounded by the inductor 142, and the cross-sectional area denotes a cross-sectional area of the line 142. According to a computer simulation, the inductor 142 has a Q value of about 50 and an inductance of about 2.78 nH at a frequency of about 1.6 GHz. The Q value and inductance of the inductor 142 may be adjusted by adjusting the area and cross-sectional area. Also, according to a computer simulation, the Q value of the inductor 142 tends to increase along with an increase in an operating frequency. An inductor implemented in the chip 120 through a general complementary metal oxide semiconductor (CMOS) process has a Q value ranging from about 10 to about 15. As mentioned above, a low Q value of a CMOS inductor results from loss caused by interaction between a substrate and the inductor, and the like. On the other hand, the inductor 142 using a pattern on a film can be fabricated separately from the chip 120. Thus, no loss is caused by interaction between a substrate and the inductor 142, and the inductor 142 can be implemented to have a high Q value.

In the drawing, the inductor 142 using a pattern on a film disposed on the same plane as the chip 120 is shown as an example. The inductor 142 shown in the drawing does not overlap the chip 120 except for a portion connected with a pad of the chip 120. In other words, a predominant portion of a conductive line constituting the inductor 142 is disposed on the insulating substrate 110 to be spaced apart from the chip 120, and thus loss caused by interaction between the inductor 142 and an internal circuit of the chip 120 or a semiconductor substrate can be effectively reduced. A ratio of the portion of the inductor 142 connected with the pad of the chip 120 to the inductor 142 can be adjusted by changing the design of the inductor 142 or the disposition of the pad of the chip 120. In other words, when the inductor 142 is implemented using a pattern on a film disposed on the same plane as the chip 120, loss caused by interaction between the chip 120 and the inductor 142 can be reduced, and inductance having a high Q value can be provided to the chip 120. In another embodiment, the inductor 142 using a pattern on a film may be disposed on the chip 120, unlike the drawing. In this case, an interval between the chip 120 and the inductor 142 increases by a thickness of the film, and loss caused by interaction between a substrate and the inductor 142 is reduced. In this way, inductance having a high Q value can be provided to the chip 120. For example, the inductor 142 implemented on the plastic film may be disposed on a semiconductor substrate having a thickness of about 280 μm and an electrical conductivity of about 10 μm. According to a computer simulation, the inductor 142 has a Q value of about 36 and an inductance of about 2.78 nH at a frequency of about 1.6 GHz. In other words, the inductor 142 can be implemented to have a higher Q value than an inductor implemented in the chip 120 through a general CMOS process. The Q value and inductance of the inductor 142 can be adjusted by adjusting the area and cross-sectional area.

The inductor 142 is connected with the oscillator 130. The LC oscillator 130 fabricated in this way can be used as an LC VCO in a driver IC employing a high-speed serial interface. Using a PLL employing the LC VCO, a clock recovery circuit having a small jitter value can be obtained. The driver IC may be installed in the insulating substrate 110 having the form of a film, and the inductor 142 can be implemented using a metal pattern on the insulating substrate 110. When the inductor 142 is implemented using a pattern on a film as shown in the drawing, a process of fabricating the chip 120 including the driver IC, etc. does not require a thick metal layer (e.g., a copper interconnection having a thickness of 2 μm or more). Thus, a factor increasing the price of the chip 120 can be removed. When the size of the insulating substrate 110 is relatively large, the inductor 142 having an inductance of several nH can be implemented using a conductive line having one turn. The inductance of the inductor 142 can be adjusted by changing a length or width of the conductive line.

Figure 2A:
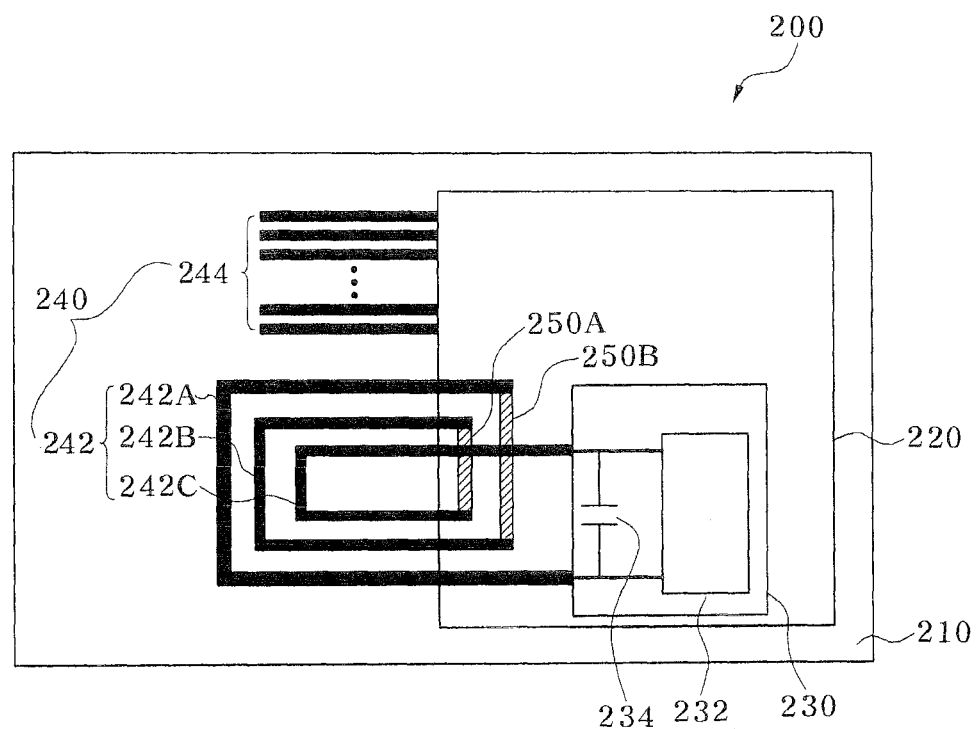
FIGS. 2(a) and 2(b) illustrate a signal generator according to another embodiment of the present disclosure.
Figure 2B:
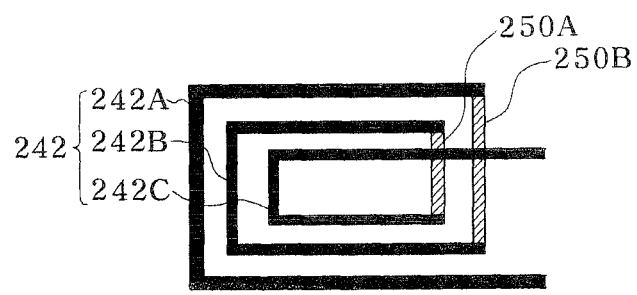

FIG. 2 illustrates a signal generator according to another embodiment of the present disclosure. FIGS. 2(A) and 2(B) illustrate a signal generator and an inductor, respectively. Referring to FIG. 2(A), a signal generator 200 includes an insulating substrate 210, a chip 220, and a plurality of conductive lines 240.

The chip 220 is disposed on the insulating substrate 210, and includes an oscillator 230 including a capacitance element which determines a resonant frequency signal. In the drawing, the oscillator 230 including a capacitor 234 is shown as an example. In an embodiment, the chip 220 includes at least one conductive coupling line, and at least some of the plurality of conductive lines may be electrically connected with the oscillator 230 through the conductive coupling line. In the drawing, the chip 220 including two conductive coupling lines 250A and 250B is shown as an example. Also, a conductive line 242 electrically connected with the oscillator 230 through the conductive lines 250A and 250B is shown as an example in the drawing. A variety of conductive materials can be used for the at least one conductive coupling line 250A and 250B. The at least one conductive coupling line 250A and 250B may include, for example, at least one material selected from among gold, copper, aluminum, and a combination thereof, The plurality of conductive lines 240 are disposed on the same surface of the insulating material 210 to be spaced apart from each other. At least some 242A, 242B and 242C of the plurality of conductive lines 240 may be electrically connected to each other to form a loop having a plurality of turns. In this case, the loop may be electrically connected with the oscillator 230 and provide an inductance element to the oscillator 230. In other words, the loop serves as an inductor. Inductance of the loop can be adjusted by adjusting the number of turns of the loop and/or a length, width, etc. of the conductive line 242A, 242B or 242C. The loop may have various shapes. For example, the shape of the loop may be at least one selected from among a rectangular spiral, a polygon spiral, a circular spiral, and a combination thereof. In FIG. 2(A), a rectangular spiral loop having three turns is shown as an example. The rectangular spiral loop is electrically connected with the oscillator 230 and provides the inductance element to the oscillator 230. The loop can be implemented by electrically connecting the conductive lines 242A, 242B and 242C with the conductive coupling lines 250A and 25B. In other embodiments, loops having various numbers of turns can be implemented by adjusting the number of conductive lines forming the loop and the number of conductive coupling lines connecting the conductive lines with each other, unlike the drawing. FIG. 2(B) shows a rectangular spiral loop implemented by the conductive lines 242A, 242B and 242C and the conductive coupling lines 250A and 250B. In an embodiment, the conductive coupling lines 250A and 250B may be embedded in the chip 220. In this case, the conductive coupling lines 250A and 250B can be electrically connected with the conductive lines 242A, 242B and 242C through a via (not shown) or contact hole (not shown). The conductive coupling lines 250A and 250B and the via or contact hole can be formed all together through a process of fabricating the chip 220, thus not requiring additional fabrication cost. A signal generated by the chip 220, an external signal (e.g., power) supplied to the chip 220, etc. can be provided through conductive lines 244.

Referring back to the drawing, since the plurality of conductive lines 240 are disposed on the same surface of the insulating substrate 210 to be spaced apart from each other, a loop having a plurality of turns cannot be implemented by the plurality of conductive lines 240 only. When an insulating substrate having multiple layers is used as the insulating substrate 210, the loop can be implemented by connecting conductive lines through a via or contact hole. However, in this case, an additional process of forming the via or contact hole, and the like may be a factor increasing the manufacturing cost of the signal generator. When a loop having a plurality of turns is implemented by introducing at least one conductive coupling line 250 into the chip 220 as described in an embodiment of the present disclosure, the cost-increasing factor can be removed. Constitutions, materials, characteristics, etc. of the insulating substrate 210, the chip 220, the oscillator 230, an oscillator core 232, the capacitor 234, and the plurality of conductive lines 240 are substantially the same as those of the insulating substrate 110, the chip 120, the oscillator 130, the oscillator core 132, the capacitor 134, and the plurality of conductive lines 140 described with reference to FIG. 1, and thus the detailed description thereof will not be reiterated.

FIG. 3 illustrates an inductor using a pattern on a film described with reference to FIGS. 1 and 2, and a signal generator employing the inductor.

Figure 3A:
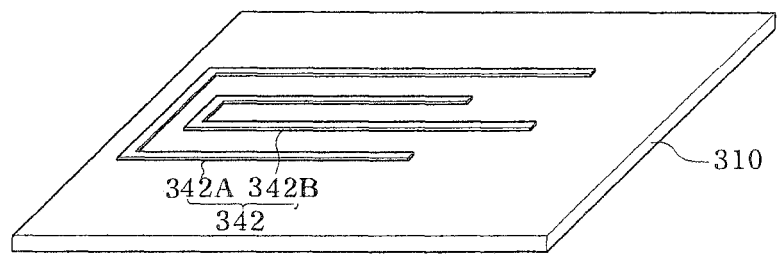
FIGS. 3(a), 3(b) and 3(c) illustrate an inductor using a pattern on a film described with reference to FIGS. 1 and 2, and a signal generator employing the inductor.
Figure 3B:
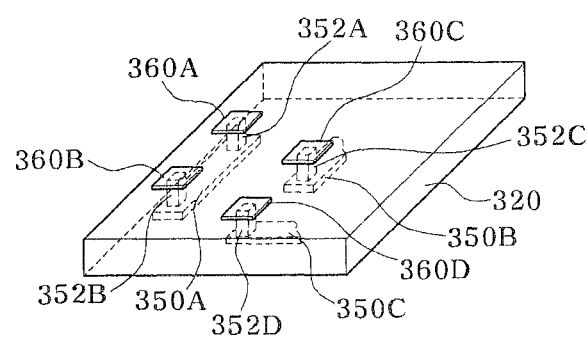
Figure 3C:
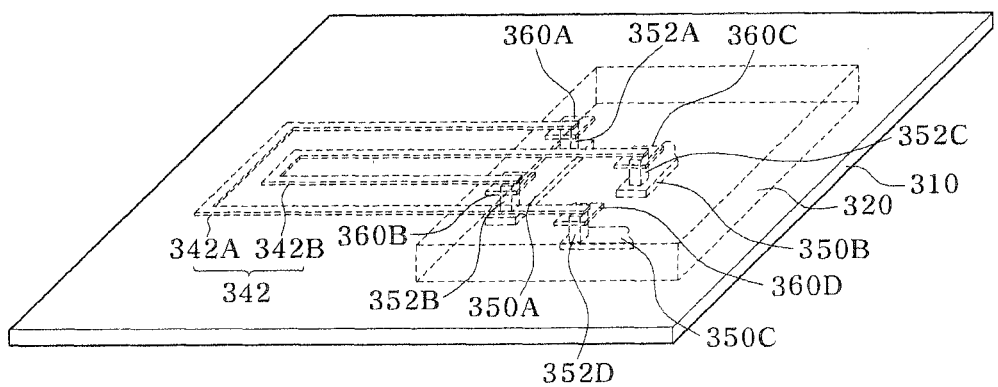

FIG. 3(A) shows an insulating substrate 310 in which a plurality of conductive lines are disposed. To simplify description, a plurality of conductive lines 342 providing an inductance element to a chip 320 are shown as an example of the plurality of conductive lines. FIG. 3(B) illustrates the chip 320. To simplify description, a portion of the chip 320 is shown as an example in the drawing. The chip 320 may include conductive coupling lines 350A, 350B and 350C. Also, the chip 320 may include conductive pads 360A, 360B, 360C and 360D and conductive vias 352A, 352B, 352C and 352D. FIG. 3(C) illustrates the chip 320 combined with the insulating substrate 310 in which the plurality of conductive lines 342 are disposed. As shown in the drawing, a rectangular spiral loop having two turns can be obtained using the plurality of conductive lines 342, the conductive coupling line 350A, the pads 360A and 360B, and the vias 352A and 352B. The rectangular spiral loop can be electrically connected to the conductive coupling lines 350B and 350C through the pads 360C and 360D and the vias 352C and 352D. In this way, a rectangular spiral inductor having two turns can be obtained. The conductive coupling lines 350B and 350C are electrically connected with an oscillator (not shown) included in the chip 320 and can provide an inductance element to the oscillator. The oscillator is substantially the same as the oscillator 230 described with reference to FIG. 2, and thus the detailed description thereof will not be reiterated. In another embodiment, the plurality of conductive lines 342 may be electrically connected with the conductive coupling lines 350A, 350B and 350C not through the pads 360A, 360B, 360C and 360D but through the vias 352A, 352B and 352C, unlike the drawing. In this case, the pads 360A, 360B, 360C and 360D can be omitted. This embodiment is an example to aid in understanding the present disclosure, and loops having various numbers of turns in various forms can be obtained by changing the numbers, structures, etc. of conductive lines, conductive coupling lines, and vias, unlike the drawing. A signal generated by the chip 320, an external signal (e.g., power) supplied to the chip 320, etc. can be provided through an additional conductive line (not shown).

Referring back to the drawing, the signal generator uses the conductive lines 342, the conductive coupling lines 350A, 350B and 350C, the pads 360A, 360B, 360C and 360D, and the vias 352A, 352B, 352C and 352D that are electrically connected to each other as an inductor. In this case, a portion of the conductive lines 342 connected with the pads 360A, 360B, 360C and 360D, the conductive coupling lines 350A, 350B and 350C, the pads 360A, 360B, 360C and 360D, and the vias 352A, 352B, 352C and 352D are disposed in the chip 320. In other words, the inductor can be divided into a first inductor and a second inductor connected in series. The first inductor is obtained from a portion of the conductive lines 342 disposed on the insulating substrate 310, and the second inductor is obtained from the portion of the conductive lines 342 disposed in the chip 320. The second inductor may interact with an internal circuit of the chip 320 or a semiconductor substrate. In this case, loss may be caused in the second inductor and have influence on inductance or a Q value of the inductor. For example, the influence of the loss on the inductance or the Q value of the inductor may be at an ignorable level. On the other hand, when the influence of the loss on the inductance or the Q value of the inductor is at an unignorable level, the loss can be reduced by changing a structure, disposition, etc. of the second inductor. For example, the inductor design is changed to increase a ratio of the first inductor to the whole inductor, thereby reducing the loss. In this way, inductance having a high Q value can be provided to the chip 320, Constitutions, materials, characteristics, etc. of the insulating substrate 310, the chip 320, the conductive lines 342A and 342B, and the conductive coupling lines 350A, 350B and 350C are substantially the same as those of the insulating substrate 210, the chip 220, the conductive lines 242A, 242B and 242C, and the conductive coupling lines 250A and 250B described with reference to FIG. 2, and thus the detailed description thereof will not be reiterated.

FIG. 4 illustrates a signal generator according to still another embodiment of the present disclosure. Referring to FIG. 4(A), a signal generator 400 includes an insulating substrate 410, a chip 420, and a plurality of conductive lines 440.

The chip 420 is disposed on the insulating substrate 410, and includes an oscillator 430 including a capacitance element which determines a resonant frequency signal. In the drawing, the oscillator 430 including a capacitor 434 is shown as an example. In an embodiment, the chip 420 may include a switch circuit 450. In this case, at least some of the plurality of conductive lines 440 can be electrically connected with the oscillator 430 through the switch circuit 450. In the drawing, a conductive line 442 electrically connected with the oscillator 430 through the switch circuit 450 is shown as an example. Various types of switch circuits can be used as the switch circuit 450. The switch circuit 450 may be, for example, an electrical switch or a mechanical switch. For example, the electrical switch may be implemented through a semiconductor process used for fabricating the chip 420. The switch implemented through the semiconductor process used for fabricating the chip 420 can be an N-channel MOS transistor, a P-channel MOS transistor, a bipolar junction transistor (BJT), a gallium arsenide (GaAs) transistor, and the like. The mechanical switch may be a micro-electro-mechanical system (MEMS) switch.

The plurality of conductive lines 440 are disposed on the same surface of the insulating substrate 410 to be spaced apart from each other. At least some 442A and 442B of the plurality of conductive lines 440 may be electrically connected to each other to form a loop having a plurality of turns. In this case, the loop may be electrically connected with the oscillator 430 and provide an inductance element to the oscillator 430. In other words, the loop serves as an inductor. Inductance of the loop can be adjusted by adjusting the number of turns of the loop and/or a length, width, etc. of the conductive line 442A or 442B. The loop may have the variety of shapes described with reference to FIG. 2. In FIG. 4(A), the two conductive lines 442A and 442B electrically connected with the oscillator 430 and providing an inductance element to the oscillator 430 are shown as an example. The respective conductive lines 442A and 442B may be electrically connected with the oscillator 430 through the switch circuit 450. Also, the conductive lines 442A and 442B may be connected in parallel or in series with the oscillator 430 through the switch circuit 450. In another embodiment, conductive lines electrically connected with the oscillator 430 and providing an inductance element to the oscillator 430 may have various numbers, unlike the drawing to By adjusting the number of conductive lines and modifying a switch circuit connecting the conductive lines with each other, loops having various numbers of turns can be implemented. The connection between the oscillator and a conductive line providing an inductance element to the oscillator 430 can be inferred from the method described with reference to FIG. 3, and the detailed description of the connection will be omitted.

FIG. 4(B) shows an inside of the switch circuit 450 connecting the conductive lines 442A and 442B. By turning on or off respective switches S1, S2, S3, S4, S5 and S6, an inductance value provided to the oscillator 430 can be adjusted. As an example, when the switches S1 and S4 are turned on and the other switches S2, S3, S5 and S6 are turned off, inductance of the conductive line 442A can be provided to the oscillator 430. As another example, when the switches S2 and S3 are turned on and the other switches S1, S4, S5 and S6 are turned off, inductance of the conductive line 442B can be provided to the oscillator 430. As still another example, when the switches S1, S2, S3 and S4 are turned on and the other switches S5 and S6 are turned off, parallel inductance of the conductive lines 442A and 442B can be provided to the oscillator 430. As yet another example, when the switches S2, S4 and S6 are turned on and the other switches S1, S3 and S5 are turned off, serial inductance of the conductive lines 442A and 442B can be provided to the oscillator 430. FIG. 4(C) shows the conductive lines 442A and 442B connected in series by the switch circuit 450. A conductive coupling line 452 is a conductive path formed by the switch S6. In the drawing, the switch circuit 450 including the six switches S1 to S6 is shown as an example. This is an example to aid in understanding the present disclosure, and the switch circuit 450 may include switches having various numbers and dispositions other than those mentioned above. Also, in the drawing, a switch circuit embedded in the chip 420 is shown as an example of the switch circuit 450. The switch circuit 450 can be formed through a process of fabricating the chip 420, thus not requiring additional fabrication cost. As another example, the switch circuit 450 may be fabricated separately from the chip 420. In this case, the switch circuit 450 can be electrically connected with the chip 420 including the plurality of conductive lines 440 and the oscillator 430 in various ways. For example, the switch circuit 450 may be embedded in a surface of the insulating substrate 410 in which the plurality of conductive lines 440 and the chip 420 are disposed, and electrically connected with the plurality of conductive lines 440 and the chip 420. A signal generated by the chip 420, an external signal (e.g., power) supplied to the chip 420, etc. can be provided through conductive lines 444.

Referring back to the drawing, since the plurality of conductive lines 440 are disposed on the same surface of the insulating substrate 410 to be spaced apart from each other, a loop having a plurality of turns cannot be implemented by the plurality of conductive lines 440 only. When an insulating substrate having multiple layers is used as the insulating substrate 410, the loop can be implemented by connecting conductive lines through a via or contact hole. However, in this case, an additional process of forming the via or contact hole, and the like may be a factor increasing the manufacturing cost of the signal generator. When a loop having a plurality of turns is implemented by introducing the switch circuit 450 into the chip 420 as described in an embodiment of the present disclosure, the cost-increasing factor can be removed. Constitutions, materials, characteristics, etc. of the insulating substrate 410, the chip 420, the oscillator 430, an oscillator core 432, the capacitor 434, and the plurality of conductive lines 440 are substantially the same as those of the insulating substrate 110, the chip 120, the oscillator 130, the oscillator core 132, the capacitor 134, and the plurality of conductive lines 140 described with reference to FIG. 1, and thus the detailed description thereof will not be reiterated.

Referring back to FIGS. 1 to 4, a high-performance inductor can be implemented using an inductor implementation method proposed according to an embodiment of the present disclosure. An inductor according to an embodiment of the present disclosure is fabricated in a process separate from a chip fabrication process. Thus, a process of implementing an inductor can be removed from a process of fabricating a chip including a driver IC, etc. In this way, an LC VCO having a low jitter characteristic can be provided to an LCD panel. Since an LC VCO having a low jitter characteristic can be used in a CDR circuit, a driver IC having a high-speed serial interface can be implemented in an LCD panel. Also, when an LC VCO proposed according to an embodiment of the present disclosure is employed in a system, deterioration of interface performance caused by power supply noise resulting from operation of a driver IC and the like is reduced, and the system becomes more stable.

The foregoing is illustrative of the present disclosure and is not to be construed as limiting thereof. Although numerous embodiments of the present disclosure have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. Therefore, it is to be understood that the foregoing is illustrative of the present disclosure and is not to be construed as limited to the specific embodiments disclosed, and that modifications to the disclosed embodiments, as well as other embodiments, are intended to be included within the scope of the appended claims. The present disclosure is defined by the following claims, with equivalents of the claims to be included therein.

What is claimed is:

1. A signal generator, comprising:
   an insulating substrate;
   a chip disposed on the insulating substrate and including an oscillator including a capacitance element determining a resonant frequency signal;
   a plurality of conductive lines disposed on the same surface of the insulating substrate to be spaced apart from each other; and
   a switch circuit connecting the plurality of conductive lines to the oscillator, the switch circuit including first switches that selectively connect or disconnect a first end and a second end of each of the conductive lines to the oscillator, and second switches that selectively connect or disconnect the plurality of conductive lines to each other, wherein
   at least one of the plurality of conductive lines is electrically connected with the oscillator and provides an inductance element determining the resonant frequency signal to the oscillator,
   the switch electrically connects at least some of the plurality of conductive lines to each other to form a loop having at least one turn,
   the chip includes at least one conductive coupling line,
   the at least one conductive coupling line is disposed on the same surface of the insulating substrate as the plurality of conductive lines, and
   at least some of the plurality of the conductive lines are electrically connected with the oscillator through the at least one conductive coupling line.

2. The signal generator according to claim 1, wherein the insulating substrate includes a flexible printed circuit board (PCB).

3. The signal generator according to claim 1, wherein the at least some of the plurality of conductive lines are electrically connected with each other to form a loop having a plurality of turns, and
   the loop is electrically connected with the oscillator to provide the inductance element to the oscillator.

4. The signal generator according to claim 3, wherein a shape of the loop includes at least one selected from among a rectangular spiral, a polygon spiral, a circular spiral, and a combination thereof.

5. The signal generator according to claim 1, wherein a value of the capacitance element is adjusted by a control voltage.

6. The signal generator according to claim 1, wherein the chip includes at least one selected from among a phase-locked loop (PLL), a clock and data recovery (CDR), a driver integrated circuit (IC), and a combination thereof.

7. The signal generator according to claim 1, wherein the plurality of conductive lines include at least one material selected from among gold, copper, aluminum, and a combination thereof.

8. A signal generator, comprising:
   an insulating substrate;
   a chip disposed on the insulating substrate and including an oscillator including a capacitance element determining a resonant frequency signal;
   a plurality of conductive lines entirely disposed on the same surface of the insulating substrate to be spaced apart from each other;
   a plurality of pads disposed on the chip, a respective one of the conductive lines connected to corresponding ones of the pads;
   a plurality of conductive vias, a respective one of the conductive vias being connected to corresponding ones of the pads; and
   a plurality of conductive coupling lines, a respective one of the conductive coupling lines being connected to corresponding ones of the conductive vias, the conductive coupling lines being connected to the oscillator, wherein
   at least one of the plurality of conductive lines is electrically connected with the oscillator and provides an inductance element determining the resonant frequency signal to the oscillator,
   the chip includes a switch circuit, and
   the at least some of the plurality of the conductive lines are connected with the oscillator through the switch circuit.

9. The signal generator according to claim 8, wherein the insulating substrate includes a flexible printed circuit board (PCB).

10. The signal generator according to claim 8, wherein at least some of the plurality of conductive lines are electrically connected with each other to form a loop having a plurality of turns, and
    the loop is electrically connected with the oscillator to provide the inductance element to the oscillator.

11. The signal generator according to claim 10, wherein a shape of the loop includes at least one selected from among a rectangular spiral, a polygon spiral, a circular spiral, and a combination thereof.

12. The signal generator according to claim 8, wherein a value of the capacitance element is adjusted by a control voltage.

13. The signal generator according to claim 8, wherein the chip includes at least one selected from among a phase-locked loop (PLL), a clock and data recovery (CDR), a driver integrated circuit (IC), and a combination thereof.

14. The signal generator according to claim 8, wherein the plurality of conductive lines include at least one material selected from among gold, copper, aluminum, and a combination thereof.

* * * * *